(12) United States Patent
Morita et al.

(10) Patent No.: US 8,123,833 B2
(45) Date of Patent: Feb. 28, 2012

(54) PROCESS FOR PRODUCING GAS-CONTAINING CLEANING WATER, APPARATUS FOR PRODUCING THE CLEANING WATER AND CLEANING APPARATUS

(75) Inventors: Hiroshi Morita, Hadano (JP); Hiroto Tokoshima, Shimotsuga-gun (JP)

(73) Assignee: Kurita Water Industries Ltd., Tokyo (JP)

( * ) Notice: Subject to any disclaimer, the term of this patent is extended or adjusted under 35 U.S.C. 154(b) by 711 days.

(21) Appl. No.: 12/225,038

(22) PCT Filed: Mar. 12, 2007

(86) PCT No.: PCT/JP2007/055336
§ 371 (c)(1),
(2), (4) Date: Oct. 29, 2008

(87) PCT Pub. No.: WO2007/105820
PCT Pub. Date: Sep. 20, 2007

(65) Prior Publication Data
US 2009/0165829 A1     Jul. 2, 2009

(30) Foreign Application Priority Data

Mar. 13, 2006   (JP) .................................. 2006-067406

(51) Int. Cl.
*B01D 53/22* (2006.01)
*B01D 19/00* (2006.01)
*B08B 3/10* (2006.01)
*C02F 1/20* (2006.01)

(52) U.S. Cl. ......... 95/46; 95/45; 95/55; 95/247; 95/254; 95/266; 96/4; 96/6; 96/9; 96/10; 96/193; 210/750; 210/188; 134/10; 134/105; 134/115 R; 261/75

(58) Field of Classification Search ................. 95/45, 46, 95/55, 56, 247, 254, 258, 259, 266; 96/4, 96/6, 8, 9, 10, 193; 210/750, 188, 194, 259; 134/10, 105, 115 R, 902; 261/75, 105
See application file for complete search history.

(56) References Cited

U.S. PATENT DOCUMENTS
5,073,268 A * 12/1991 Saito et al. .................... 210/638
(Continued)

FOREIGN PATENT DOCUMENTS
EP   0 433 893 A1   6/1991
(Continued)

OTHER PUBLICATIONS

Office Action (Notice of Reason(s) of Rejection) dated Jan. 27, 2011 in Japanese Applications JP 2006-067406, together with an English-language translation thereof.
(Continued)

*Primary Examiner* — Jason M Greene
(74) *Attorney, Agent, or Firm* — Holtz Holtz Goodman & Chick PC

(57) ABSTRACT

A process for producing a gas-containing cleaning water which contains a specific gas dissolved in water, which process comprises dissolving the specific gas into water under an increased pressure exceeding an atmospheric pressure to prepare a gas-containing water having a concentration of the gas exceeding solubility of the gas under an atmospheric pressure and, then, removing a portion of the dissolved gas by decreasing pressure on the gas-containing water; an apparatus for producing a gas-containing cleaning water which comprises an apparatus for dissolving a gas (14) in which a specific gas is dissolved into water under a pressure exceeding the atmospheric pressure and an apparatus for removing a portion of a dissolved gas (15) in which the pressure on the gas-containing water obtained from the apparatus for dissolving a gas is decreased to a pressure lower than the pressure under which the gas has been dissolved so that a portion of the dissolved gas is removed; and a cleaning apparatus using the gas-containing cleaning water. A gas-containing cleaning water having a desired concentration of the gas can be produced safely without using a mechanism for decreasing the pressure such as a vacuum pump. Water and the specific gas in the gas-containing cleaning water after being used can be reused. The process and the apparatuses can be advantageously applied to cleaning electronic members requiring a great degree of cleanliness.

20 Claims, 4 Drawing Sheets

U.S. PATENT DOCUMENTS

| | | | | |
|---|---|---|---|---|
| 5,522,917 | A | * | 6/1996 | Honda et al. .................. 95/46 |
| 5,614,088 | A | * | 3/1997 | Nagai et al. .................. 210/188 |
| 6,082,373 | A | * | 7/2000 | Sakurai et al. .................. 134/1 |
| 6,086,057 | A | * | 7/2000 | Mitsumori et al. ........... 210/750 |
| 6,290,777 | B1 | * | 9/2001 | Imaoka et al. .................. 134/1 |
| 2004/0118775 | A1 | * | 6/2004 | Murota et al. ............... 210/634 |
| 2005/0093182 | A1 | * | 5/2005 | Morita et al. .................. 261/26 |
| 2009/0025761 | A1 | * | 1/2009 | Matsumoto et al. ......... 134/133 |

FOREIGN PATENT DOCUMENTS

| | | |
|---|---|---|
| JP | 07-060005 A | 3/1995 |
| JP | 3521393 A | 1/1997 |
| JP | 11-077021 A | 3/1999 |
| JP | 2000-288490 A | 10/2000 |
| JP | 2002-143659 A | 5/2002 |
| JP | 2004-351399 A | 12/2004 |

OTHER PUBLICATIONS

Chinese First Office Action dated Jan. 8, 2010 in the corresponding Chinese application together with a Japanese-language translation thereof and an English-language translation of the main portions of the Japanese-language translation.

English-language communication from the Intellectual Property Office of Singapore dated Jan. 11, 2010 in the corresponding Singapore application, together with the English-language Austrian Patent Office Service and Information Center Search Report and Written Opinion directed to the Intellectual Property Office of Singapore.

Office Action dated Jun. 9, 2010 in the priority Japanese Application JP 2006-067406 , together with an English-language translation thereof.

Japanese Office Action dated Jun. 27, 2011 in Japanese Patent Application No. 2006-067406.

* cited by examiner

PROCESS FOR PRODUCING GAS-CONTAINING CLEANING WATER, APPARATUS FOR PRODUCING THE CLEANING WATER AND CLEANING APPARATUS

This application is the United States national phase application of International Application PCT/JP2007/055336 filed Mar. 12, 2007.

TECHNICAL FIELD

The present invention relates to a process for producing a gas-containing cleaning water, an apparatus for producing the cleaning water and a cleaning apparatus. More particularly, the present invention relates to a process for producing a gas-containing cleaning water which can produce a gas-containing cleaning water having a desired concentration of the gas safely without using a mechanism for decreasing the pressure such as a vacuum pump, can reuse water and the specific gas in the gas-containing cleaning water after being used and can be advantageously applied to cleaning electronic members requiring a great degree of cleanliness such as silicon wafers for semiconductors and glass substrates for flat panel displays, an apparatus for producing the cleaning water and a cleaning apparatus.

BACKGROUND ART

Heretofore, the wet cleaning process called the RCA cleaning process has been mainly conducted for cleaning substrates used as members of electronic products. The RCA cleaning process is a cleaning process using a mixed liquid of sulfuric acid and an aqueous solution of hydrogen peroxide (SPM) heated at 120 to 150° C., a mixed liquid of ammonia and an aqueous solution of hydrogen peroxide (APM) heated at 60 to 80° C. or a mixed liquid of hydrochloric acid and an aqueous solution of hydrogen peroxide (HPM) heated at 60 to 80° C. To overcome the problems arising on application of this process such as the great cost of the chemicals and the cleaning agents in great concentrations, the cost of a great amount of pure water and ultrapure water used for removing the chemicals and the cleaning agents by rinsing, the cost of the air conditioning for removing vapor of the chemicals and freshly supplying the clean air and the load on the environment such as the use of water in a great amount, disposal of chemicals in great amounts and discharge of waste gases, various attempts to simplify the process have been made, and many achievements have been obtained. A typical example of the achievements is the ultrasonic cleaning technology using cleaning water containing a dissolved specific gas such as hydrogen.

It is the essence of the new cleaning technology that a specific gas is dissolved in a great concentration. For maintaining the great cleaning effect with stability, it is necessary the concentration of the dissolved gas be controlled at a value which is great but does not exceed the concentration of saturation under the condition of the use. It is preferable from the standpoint of safety that the concentration of the dissolved gas is kept at a value not exceeding the concentration of saturation since the undesirable possibility that the dissolved hydrogen forms bubbles and remains in the system under the atmospheric pressure increases when hydrogen is dissolved in an amount exceeding the concentration of saturation. In response to the above technological need, a technology in which, after a gas (mainly nitrogen) dissolved in pure water or ultrapure water used as the material water is removed by a degassing treatment, the gas desired to be dissolved is supplied in an amount smaller than the amount to provide the concentration of saturation and dissolved in the material water, has been developed by the present inventors. The usefulness of the above technology has been recognized, and the technology has been widely used as the novel technology for the wet cleaning.

For example, as the process for the wet treatment of articles for the treatment such as substrates for semiconductors and glass substrates for liquid crystal display devices to which extremely clean surface is required and electronic members to which the completely hydrocarbon-free surface at the room temperature is required, a process for the wet treatment of articles for the treatment in which the article for the treatment is treated with ultrapure water containing hydrogen or ultrapure water containing hydrogen and a very small amount of a rare gas under irradiation with ultrasonic wave of 20 kHz or greater, wherein the ultrapure water used as the material water is water degassed in a manner such that the content of dissolved gasses other than the rare gas is at most 10 ppm or smaller, has been proposed (Patent Reference 1).

As the apparatus for supplying ultrapure water containing hydrogen which can supply the ultrapure water for cleaning containing hydrogen to the use point with the stable concentration of the dissolved hydrogen under fluctuation of the amount of the use and does not dispose of the ultrapure water in an excess amount as waste water, an apparatus for supplying ultrapure water containing hydrogen which comprises a water tank of the closed type for holding a mixture of ultrapure water containing hydrogen left remaining without being used in the use point and ultrapure water supplied as the supplement, a pump for transferring water held in the water tank, a degassing portion for removing dissolved gases in the transferred water, a dissolving portion for dissolving hydrogen supplied from a portion for supplying hydrogen into the degassed water and a recycling pipe for recycling water to the water tank via a filter and the use point, and supplies ultrapure water containing hydrogen in an amount necessary at the use point while the ultrapure water containing hydrogen is circulated in the step of cleaning electronic materials using ultrapure water containing hydrogen, is proposed (Patent Reference 2).

In accordance with the above process or by using the above apparatus, the gas-containing cleaning water in which a specific gas is dissolved in an amount which is great but does not exceed the concentration of saturation can be efficiently produced. However, in accordance with the above process or by using the above apparatus, the step of degassing for removing the major amount of the dissolved gas from pure water or ultrapure water used as the material water is indispensable, and a suitable mechanism for decreasing the pressure such as a vacuum pump is necessary.

In the cleaning step in which a great amount of the gas-containing cleaning water is necessary, it is required for saving water that the gas-containing cleaning water after being used (waste water of cleaning) be recycled and reused. A recycling system can be constructed by removing contaminants in the waste water of cleaning and adjusting the concentration of the dissolved gas. In accordance with a conventional process, the degassing treatment is conducted after the waste water of cleaning is cleaned, and the specific gas is dissolved again. In particular, in the case of the system in which cleaning water containing dissolved hydrogen which exhibits a great cleaning effect is recycled, a considerable amount of hydrogen remains dissolved in the water although hydrogen is replaced with the air during the cleaning step and the amount of hydrogen is decreased. For removing the remaining hydrogen, the considerable amount of hydrogen must be discharged through a mechanism for decreasing the pressure such as a vacuum pump, and this procedure causes a problem on the safety. It has been desired that the above problem is overcome so that the cleaning using the gas-containing cleaning water in which a specific gas is dissolved is more effectively utilized.

[Patent Reference 1] Japanese Patent No. 3521393
[Patent Reference 2] Japanese Patent Application Laid-Open No. Heisei 11 (1999)-77021

DISCLOSURE OF THE INVENTION

The present invention has an object of providing a process for producing a gas-containing cleaning water which can produce a gas-containing cleaning water having a desired concentration of the gas safely without using a mechanism for decreasing the pressure such as a vacuum pump, can reuse water and the specific gas in the gas-containing cleaning water after being used and can be advantageously applied to cleaning electronic members requiring a great degree of cleanliness such as silicon wafers for semiconductors and glass substrates for flat panel displays, an apparatus for producing the cleaning water and a cleaning apparatus.

As the result of intensive studies by the present inventors to achieve the above object, it was found that a gas-containing cleaning water containing a specific gas in a concentration which is great but does not exceed the concentration of saturation could be prepared without using a mechanism for decreasing the pressure such as a vacuum pump by dissolving a specific gas into a material water under a pressure exceeding the atmospheric pressure to prepare a gas-containing water containing the specific gas in combination with other gases present in the material water in a concentration exceeding the concentration of saturation, followed by removing the portion of the dissolved gases exceeding the concentration of saturation by decreasing the pressure on the gas-containing water. The present invention has been completed based on the knowledge.

The present invention provides:

(1) A process for producing a gas-containing cleaning water which contains a specific gas dissolved in water, which process comprises dissolving the specific gas into water under an increased pressure exceeding an atmospheric pressure to prepare a gas-containing water having a concentration of the gas exceeding solubility of the gas under an atmospheric pressure and, then, removing a portion of the dissolved gas by decreasing pressure on the gas-containing water;

(2) The process for producing a gas-containing cleaning water described in (1), wherein the pressure on the gas-containing water is decreased to a pressure close to the atmospheric pressure;

(3) The process for producing a gas-containing cleaning water described in (2), wherein the gas-containing water is passed through a gas permeation membrane module, and a gaseous phase portion of the gas permeation membrane module is connected to the atmosphere so that the pressure on the gas-containing water is decreased to a pressure close to the atmospheric pressure;

(4) The process for producing a gas-containing cleaning water described in (1), wherein an operation of dissolving the specific gas into water under an increased pressure to prepare a gas-containing water having a concentration of the gas exceeding solubility of the gas under an atmospheric pressure and an operation of removing a portion of the dissolved gas by decreasing pressure on the gas-containing water are repeatedly conducted;

(5) The process for producing a gas-containing cleaning water described in (1), wherein the water into which the specific gas is dissolved under an increased pressure is a gas-containing cleaning water after being used;

(6) The process for producing gas-containing cleaning water described in (5), which comprises a step of removing contaminants in the gas-containing clearing water;

(7) The process for producing a gas-containing cleaning water described in any one of (1) to (6), wherein the specific gas is hydrogen, and the gas removed under a decreased pressure is treated by an apparatus for treating a waste gas;

(8) An apparatus for producing a gas-containing cleaning water which contains a specific gas dissolved in water, which apparatus comprises an apparatus for dissolving a gas in which the specific gas is dissolved into water under an increased pressure exceeding an atmospheric pressure and an apparatus for removing a portion of a gas in which a portion of the dissolved gas is removed by decreasing pressure on a gas-containing water obtained from the apparatus for dissolving a gas to a pressure lower than the pressure under which the gas has been dissolved;

(9) A cleaning apparatus which comprises a cleaning machine using a gas-containing cleaning water which contains a specific gas dissolved in water, an apparatus for dissolving a gas in which the specific gas is dissolved into a gas-containing cleaning water discharged from the cleaning machine after being used under an increased pressure exceeding an atmospheric pressure, an apparatus for removing a portion of a gas in which a portion of the dissolved gas is removed by decreasing pressure on a gas-containing water obtained from the apparatus for dissolving a gas to a pressure lower than the pressure under which the gas has been dissolved, and a piping for a gas-containing cleaning water by which the gas-containing clearing water which is discharged from the apparatus for removing a portion of a gas and contains the specific gas dissolved in water is supplied to the cleaning machine; and

(10) The cleaning apparatus described in (9), wherein the gas-containing cleaning water which is discharged from the cleaning machine after being used is circulated through a heat exchanger and an apparatus for removing contaminants.

As the preferable embodiments, the present invention provides:

(11) The apparatus for producing a gas-containing cleaning water described in (8), wherein the apparatus for removing a portion of a dissolved gas is an apparatus in which the pressure on the gas-containing water is decreased to a pressure close to the atmospheric pressure;

(12) The apparatus for producing a gas-containing cleaning water described in (11), wherein the apparatus in which the pressure on the gas-containing water is decreased to a pressure close to the atmospheric pressure is a gas permeation membrane module through which the gas-containing water is passed, and a gaseous phase portion of the gas permeation membrane module is connected to the atmosphere;

(13) The apparatus for producing a gas-containing cleaning water described in (8), wherein a plurality of pairs of the apparatus for dissolving a gas and the apparatus for removing a portion of a dissolved gas are arranged in a manner such that the apparatus for dissolving a gas and the apparatus for removing a portion of a dissolved gas are arranged alternately;

(14) The apparatus for producing a gas-containing cleaning water described in (8), which comprises a recycling pipe for recycling a gas-containing cleaning water after being used to the apparatus for dissolving a gas; and

(15) The apparatus for producing a gas-containing cleaning water described in (14), which comprises an apparatus for removing contaminants in the gas-containing cleaning water.

Figure 1:
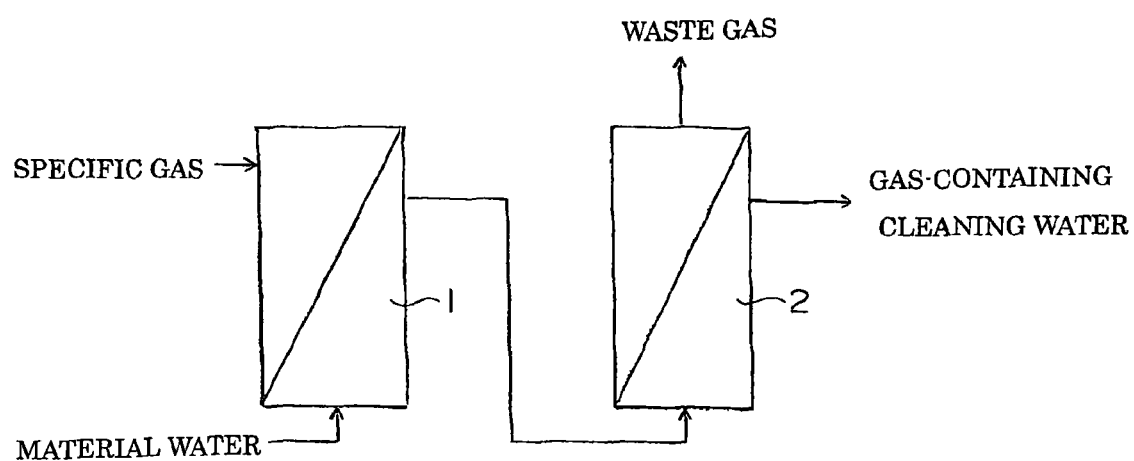
FIG. 1 shows a flow diagram exhibiting an embodiment of the process of the present invention and an embodiment of the apparatus of the present invention.

In the Figures, 1 means an apparatus for dissolving a gas, 2 means an apparatus for removing a portion of a gas, 3 means an apparatus for dissolving a gas, 4 means an apparatus for removing a portion of a gas, 5 means an apparatus for dissolving a gas, 6 means an apparatus for removing a portion of a gas, 7 means a cleaning machine, 8 means a recycling pipe, 9 means a water tank, 10 means a pressure regulator, 11 means a pump for transfer under a pressure, 12 means a heat exchanger, 13 means an ultrafiltration membrane apparatus, 14 means an apparatus for dissolving a gas, 15 means an apparatus for removing a portion of a gas, 16 means an apparatus for treating a waste gas, 17 means a piping for a gas-containing cleaning water, 18 means a pH meter, 19 means a pump, 20 means a tank for an ammonia water, 21 means a monitor for dissolved hydrogen, 22 means a first gas permeation membrane module, 23 means a valve, 24 means a mass flow controller, 25 means a cylinder of hydrogen, 26 means a pressure gauge, 27 means a mass flow controller, 28 means a second gas permeation membrane module, 29 means a third gas permeation membrane module, 30 means a piping, 31 means a flow meter for water, 32 means a meter for the hydrogen concentration, 33 means a meter for the hydrogen concentration, and 34 means a pressure gauge.

THE MOST PREFERRED EMBODIMENT TO CARRY OUT THE INVENTION

The process for producing a gas-containing cleaning water of the present invention is a process for producing a gas-containing cleaning water which process contains a specific gas dissolved in water, which comprises dissolving the specific gas into water under an increased pressure exceeding the atmospheric pressure to prepare a gas-containing water having a concentration of the gas exceeding solubility of the gas under the atmospheric pressure and, then, removing a portion of the dissolved gas by decreasing the pressure on the gas-containing water. In the process of the present invention, it is preferable that a portion of the dissolved gas is removed by decreasing the pressure on the gas-containing water to a pressure close to the atmospheric pressure so that.

The apparatus for producing a gas-containing cleaning water of the present invention is an apparatus for producing a gas-containing cleaning water which contains a specific gas dissolved in water, which apparatus comprises an apparatus for dissolving a gas in which the specific gas is dissolved into water under an increased pressure exceeding the atmospheric pressure and an apparatus for removing a portion of a gas in which a portion of the dissolved gas is removed by decreasing the pressure on a gas-containing water obtained from the apparatus for dissolving a gas to a pressure lower than the pressure under which the gas has been dissolved. In the apparatus of the present invention, it is preferable that the apparatus for removing a portion of a dissolved gas is an apparatus in which the pressure on the gas-containing water is decreased to a pressure close to the atmospheric pressure.

In the present invention, when a portion of the dissolved gas is removed by decreasing the pressure on the gas-containing water, it is preferable that the increased pressure on the gas-containing water is decreased to a pressure which is the same as or close to the atmospheric pressure such as a pressure in the range of ±20% of the atmospheric pressure. When the pressure on the gas-containing water is decreased to a pressure close to the atmospheric pressure using a membrane module, the side of the gaseous phase of the membrane module is connected to the atmosphere. In this case, some time is required before the equilibrium is achieved between the aqueous phase and the gaseous phase, and the pressure is occasionally not decreased to the atmospheric pressure when the residence time of water is short due to the capacity of the apparatus. When the pressure is decreased by connecting the gaseous phase to a piping for discharging the waste gas in a plant, the pressure in the piping for discharging the waste gas is occasionally lower than the atmospheric pressure to some degree. In this case, occasionally, the pressure of the gaseous phase becomes lower than the atmospheric pressure to some degree.

In the present invention, the apparatus for dissolving a gas in which the specific gas is dissolved into water under an increased pressure exceeding the atmospheric pressure is not particularly limited. Examples of the apparatus include gas permeation membrane modules and apparatuses in which the gas and water are directly brought into contact with each other such as ejectors and pumps exhibiting a great function of dissolving a gas. When an apparatus for dissolving a gas in which the gas and water are directly brought into contact with each other such as an ejector and a pump is used, it is preferable that a gas-liquid separator is disposed at the downstream. In the present invention, the apparatus for removing a portion of a gas in which a portion of the dissolved gas is removed by decreasing the pressure to a pressure lower than the pressure under which the gas has been dissolved is not particularly limited. Examples of the apparatus include gas permeation membrane modules and gas-liquid separators.

FIG. 1 shows a flow diagram exhibiting an embodiment of the process of the present invention and an embodiment of the apparatus of the present invention. The apparatus of the present invention comprises an apparatus for dissolving a gas 1 in which the specific gas is dissolved into water under an increased pressure exceeding the atmospheric pressure and an apparatus for removing a portion of a gas 2 in which a portion of the dissolved gas is removed by decreasing the pressure on a gas-containing water obtained from the apparatus for dissolving a gas to a pressure lower than the pressure under which the gas has been dissolved. In the present invention, it is preferable that a gas permeation membrane module is used as the apparatus for removing a portion of a gas, the gas-containing water is introduced into the aqueous phase of the gas permeation membrane module, and the pressure on the water containing the dissolved gas is decreased to the atmospheric pressure by opening the gaseous phase of the gas permeation membrane module to the atmosphere or by connecting the gaseous phase to the atmosphere in a manner such that no pressure loss is formed. In the embodiment shown in FIG. 1, the material water is introduced into the aqueous phase of the apparatus for dissolving a gas, and a specific gas is introduced into the gaseous phase under a pressure exceeding the atmospheric pressure. The specific gas is dissolved into the water via the gas permeation membrane. The water containing the dissolved gas flowing out of the apparatus for dissolving a gas is transferred to the aqueous phase of the apparatus for removing a portion of a gas. The pressure in the gaseous phase is decreased to a pressure lower than the pressure under which the gas has been dissolved, and a portion of the gas dissolved in the gas-containing water is transferred to the gaseous phase via the gas permeation membrane and removed.

In the water contacting the atmosphere of the gas at a constant temperature under a constant pressure, the gas constituting the atmosphere is dissolved under the equilibrium condition, and the degree of saturation becomes 1 in this condition. For example, in water contacting the air at 25° C., 8.1 mg/liter of oxygen and 13.8 mg/liter of nitrogen are dissolved, and the degree of saturation becomes 1 in this condition. When water is brought into contact with the atmosphere of nitrogen, the atmosphere of oxygen or the atmosphere of hydrogen under the equilibrium condition after the water is completely degassed to the condition such that the degree of saturation is 0, 17.6 mg/liter of nitrogen, 40.4 mg/liter of oxygen or 1.6 mg/liter of hydrogen, respectively, is dissolved, and the degree of saturation becomes 1 in this condition.

When 1.6 mg/liter of hydrogen as the specific gas is dissolved under an increased pressure into water containing 17.6 mg/liter of dissolved nitrogen at 25° C., the water containing the dissolved gases contains nitrogen in an amount corresponding to the degree of saturation of 1 and hydrogen in an amount corresponding to the degree of saturation of 1, and the degree of saturation in the water containing the dissolved gases becomes 2. When the pressure on the water containing the dissolved gases having the degree of saturation of 2 is decreased to the atmospheric pressure, a portion of nitrogen and a portion of hydrogen are removed, and the degree of saturation in the water containing the dissolved gases is decreased to 1. Since nitrogen and hydrogen are removed by approximately the same fraction, a water containing the dissolved gases containing 8.8 mg/liter of nitrogen and 0.8 mg/liter of hydrogen is obtained when the degree of saturation in the water containing the dissolved gases is decreased from 2 to 1.

The specific gas used in the present invention is not particularly limited. Examples of the specific gas include hydrogen, nitrogen, oxygen, carbon dioxide and rare gases. As the specific gas, a single type of a gas may be used alone, or two or more types of gases may be used in combination. In the present invention, no mechanism for decreasing the pressure such as a vacuum pump is necessary for producing the gas-containing cleaning water, and there is no danger of catching fire caused by static electricity in moving members making rotation or reciprocal movements. Therefore, the process of the present invention can be advantageously applied to production of cleaning water containing dissolved hydrogen and cleaning water containing dissolved oxygen, and more advantageously applied to production of cleaning water containing dissolved hydrogen.

In the present invention, while the pressure of the apparatus for dissolving a gas is maintained by a valve disposed at the downstream side of the apparatus for dissolving a gas, the pressure of the apparatus for removing a portion of a gas is suitably decreased to remove a portion of the dissolved gas, and the gas-containing cleaning water containing no bubbles can be introduced into the cleaning machine. When the gas permeation membrane module is used as the apparatus for dissolving a gas, the gas-containing water contain no bubbles under an increased pressure even when the gas is dissolved in an amount such that the degree of saturation exceeds 1. In this case, when the pressure is decreased in a portion after the valve disposed at the downstream side of the apparatus for dissolving a gas, a gas-liquid separator may be used since the amount exceeding the concentration of saturation is separated as bubbles. As a simpler process, another gas permeation membrane module can be used as the apparatus for removing a portion of a gas. It is preferable that, in the second gas permeation membrane module, the connection to the gaseous phase portion is formed in a manner such that the gaseous phase portion can be open to the atmosphere. When a gas-containing cleaning water which is kept at a concentration exceeding the concentration of saturation to some degree is required, the pressure of the gas can be kept at the desired value by adjusting the valve in a manner such that the valve is not completely open. The removal of the portion of the gas corresponding to the degree of saturation exceeding 1 can be accelerated by connecting the piping at the connecting point of the gaseous phase of the second gas permeation membrane module to a piping for a waste gas in a plant or an aspirator which is adjusted at a decreased pressure so that the pressure of the gaseous phase is adjusted at a pressure slightly lower than the atmospheric pressure. When the gas permeation membrane module is used for both of the apparatus for dissolving a gas and the apparatus for removing a portion of a gas, it is not necessary that the pressure of water is decreased at the downstream side of the apparatus for dissolving a gas, and the gas-containing water having the prescribed pressure of water can be transferred to the cleaning machine.

Figure 2:
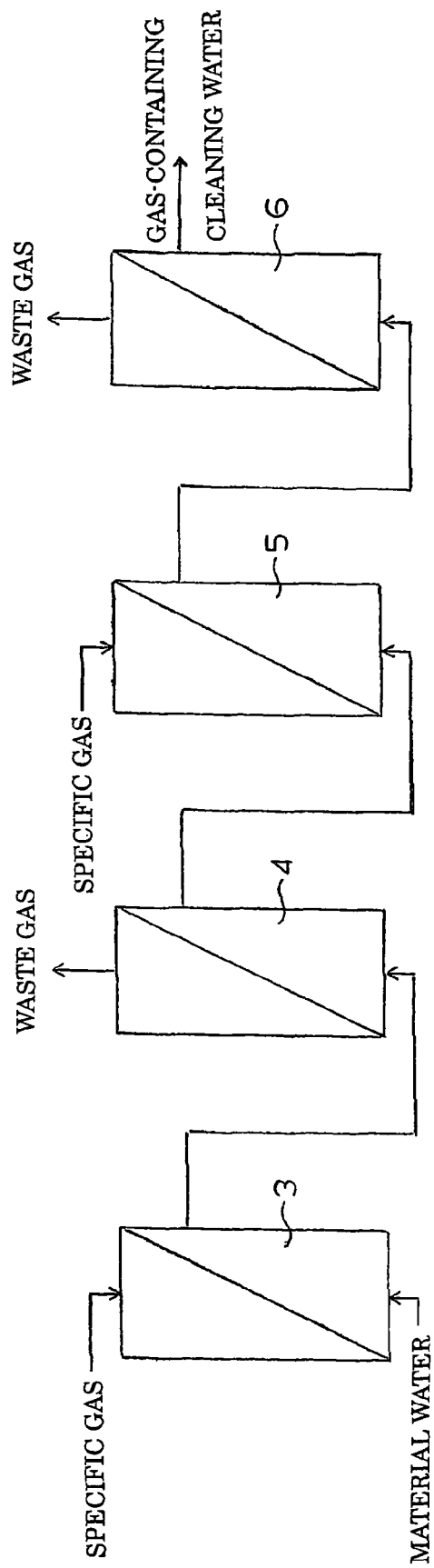
FIG. 2 shows a flow diagram exhibiting another embodiment of the process of the present invention and another embodiment of the apparatus of the present invention.

In the process of the present invention, the operation of dissolving the specific gas into water under an increased pressure to prepare a gas-containing water having a concentration of the gas exceeding solubility of the gas under an atmospheric pressure and the operation of removing a portion of the dissolved gas by decreasing the pressure on the gas-containing water may be repeatedly conducted. The apparatus of the present invention may be an apparatus comprising a plurality of pairs of the apparatus for dissolving a gas and the apparatus for removing a portion of a dissolved gas arranged in a manner such that the apparatus for dissolving a gas and the apparatus for removing a portion of a dissolved gas are arranged alternately. FIG. 2 shows a flow diagram exhibiting another embodiment of the process of the present invention and another embodiment of the apparatus of the present invention. In the present embodiment, an apparatus for dissolving a gas 3, an apparatus for removing a portion of a gas 4, another apparatus for dissolving a gas 5 and another apparatus for removing a portion of a gas 6 are arranged in this order, and the aqueous phases of the apparatuses are connected in series. The material water is introduced into the aqueous phase of the first apparatus for dissolving a gas 3, and the specific gas is introduced into the gaseous phase under an increased pressure exceeding the atmospheric pressure and dissolved into water. The gas-containing water flowing out of the first apparatus for dissolving a gas is sent to the aqueous phase of the first apparatus for removing a portion of a gas 4, and a portion of the gas dissolved in the gas-containing water is transferred to the gaseous phase and removed. The gas-containing water flowing out of the first apparatus for removing a portion of a gas is introduced into the aqueous phase of the second apparatus for dissolving a gas 5, and the specific gas is introduced into the gaseous phase under an increased pressure exceeding the atmospheric pressure and dissolved into water. The gas-containing water flowing out of the second apparatus for dissolving a gas is sent to the aqueous phase of the second apparatus for removing a portion of a gas 6, and a portion of the gas dissolved in the gas-containing water is transferred to the gaseous phase and removed.

In the present invention, the concentration of the specific gas in the obtained gas-containing water can be increased by repeating the operation of dissolving the gas into water under an increased pressure to obtain a gas-containing water in a concentration exceeding the concentration of saturation under the atmospheric pressure and the operation of removing a portion of the dissolved gas by decreasing the pressure on the gas-containing water. For example, when 1.6 mg/liter of hydrogen as the specific gas is dissolved into water in which 17.6 mg/liter of nitrogen is dissolved at 25° C. in the first apparatus for dissolving a gas under an increased pressure, nitrogen in an amount corresponding to the degree of saturation of 1 and hydrogen in an amount corresponding to the degree of saturation of 1 are dissolved in the gas-containing water, and the degree of saturation in the gas-containing water becomes 2. When the pressure on the gas-containing water having the degree of saturation of 2 is decreased to the atmospheric pressure in the first apparatus for removing a portion of a gas, a portion of nitrogen and a portion of hydrogen are removed, and the degree of saturation of the gas-containing water is decreased to 1. Since nitrogen and hydrogen are removed by approximately the same fraction, a gas-containing water containing 8.8 mg/liter of nitrogen gas and 0.8 mg/liter of hydrogen is obtained.

When 1.6 mg/liter of hydrogen as the specific gas is dissolved into the gas-containing water in which 8.8 mg/liter of nitrogen and 0.8 mg/liter of hydrogen are dissolve in the second apparatus for dissolving a gas under an increased pressure, nitrogen in an amount corresponding to the degree of saturation of 0.5 and hydrogen in an amount corresponding to the degree of saturation of 1.5 are dissolved in the gas-containing water, and the degree of saturation in the gas-containing water becomes 2. When the pressure on the gas-containing water having the degree of saturation of 2 is decreased to the atmospheric pressure in the second apparatus for removing a portion of a gas, a portion of nitrogen and a portion of hydrogen are removed, and the degree of saturation of the gas-containing water is decreased to 1. Since nitrogen and hydrogen are removed by approximately the same fraction, a gas-containing water containing 4.4 mg/liter of nitrogen gas and 1.2 mg/liter of hydrogen is obtained.

In the case of the repeated operations, the amount of hydrogen required for obtaining a hydrogen-containing cleaning water having a concentration of dissolved hydrogen of 1.2 mg/liter (the degree of saturation: 0.75) from water having a concentration of dissolved hydrogen of 0 mg/liter is the amount corresponding to the degree of saturation of 2. When the dissolution under an increased pressure and the removal of the amount exceeding the concentration of saturation are conducted in a single step, hydrogen in an amount corresponding to the degree of saturation of 3 is necessary for obtaining the hydrogen-containing cleaning water having a concentration of dissolved hydrogen of 1.2 mg/liter. Moreover, a pressure of 0.3 MPa or greater as the gauge pressure is necessary for pressing the gas into the water. The process of repeated operations is advantageous in that the amount and the pressure of the gas necessary for obtaining the desired concentration of the dissolved gas are smaller although the additional gas permeation membrane module is necessary. In one of conventional processes for dissolving a gas, the gas desired to be dissolved is passed through the side of the gaseous phase in the gas permeation membrane module so that the gas already dissolved in the aqueous phase is replaced with the desired gas. However, in accordance with the above conventional process, the sufficiently great efficiency is not obtained in the replacement. For example, when a hydrogen-containing cleaning water is produced, it is difficult that a concentration of the dissolved hydrogen of 1 mg/liter or greater is obtained even when hydrogen in an amount 5 times the amount of saturation (an amount corresponding to the degree of saturation of 5) is passed.

In the process for producing a gas-containing cleaning water of the present invention, a gas-containing cleaning water after being used can be used as the water for dissolving the specific gas under an increased pressure. When the gas-containing cleaning water after being used is used as the water for dissolving the specific gas under an increased pressure, it is preferable that contaminants contained in the gas-containing cleaning water are removed. In the apparatus for producing a gas-containing cleaning water of the present invention, a recycling pipe for recycling the gas-containing cleaning water after being used to the apparatus for dissolving a gas may be disposed. In the apparatus of the present invention, it is preferable that an apparatus for removing contaminants in the gas-containing cleaning water is disposed.

Figure 3:
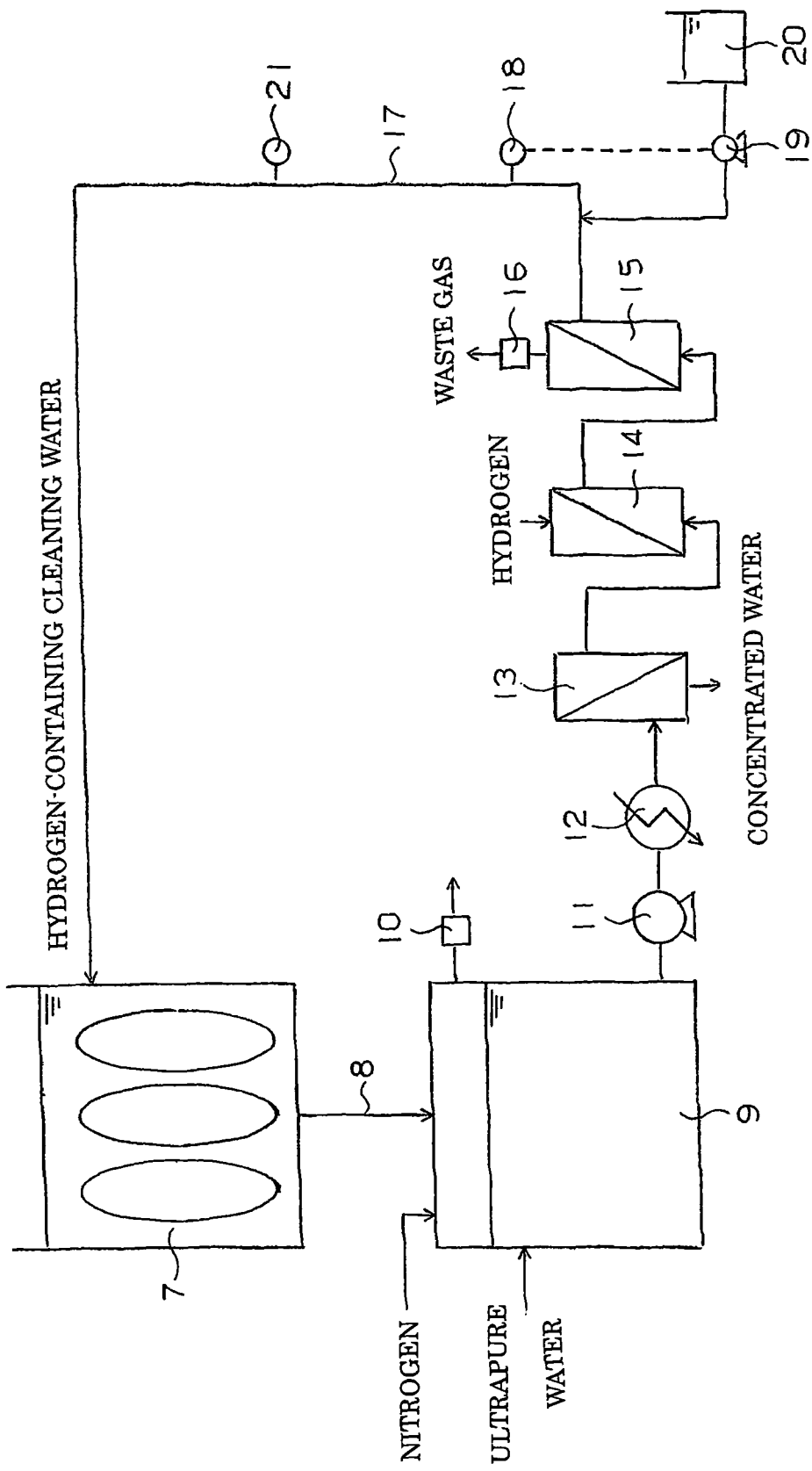
FIG. 3 shows a flow diagram exhibiting still another embodiment of the process of the present invention and still another embodiment of the apparatus of the present invention.

FIG. 3 shows a flow diagram exhibiting still another embodiment of the process of the present invention and still another embodiment of the apparatus of the present invention. A hydrogen-containing cleaning water after being used in a washing machine 7 is recycled to a water tank 9 via a recycling pipe 8. A piping for supplementing with ultrapure water, a piping for supplying nitrogen into the space in the upper portion of the water tank and a pressure regulator 10 for keeping the pressure in the space of the upper portion of the water tank greater than the atmospheric pressure are disposed at the water tank. Water kept in the water tank is sent out by a pump for transfer under a pressure 11 and treated for the temperature adjustment at a heat exchanger 12 and, then, fine particles mixed into the system during the operation of cleaning are removed by an ultrafiltration membrane apparatus 13. Dusts derived from the pump can also be removed by disposing the ultrafiltration membrane apparatus at this position. Concentrated water is removed from the ultrafiltration membrane apparatus, and the water in the water tank is supplemented with ultrapure water in an amount corresponding to the amount of the removed concentrated water so that the amount of water in the system is kept constant. The supplementation with ultrapure water in the amount corresponding to the amount of the removed concentrated water may be conducted at the piping between the ultrafiltration membrane apparatus and the apparatus for dissolving a gas. Occasionally, a portion of water discharged from the cleaning step after being used is discharged to the outside of the system in addition to the removal of the concentrated water from the ultrafiltration membrane apparatus. When the supplementation with ultrapure water is necessary, the supplementation may be conducted at an upstream position of the water tank or the apparatus for dissolving a gas or at a desired position in the system such as the cleaning machine.

In the embodiment shown in FIG. 3, the ultrafiltration membrane apparatus is used as the apparatus for removing contaminants. A suitable apparatus for removing contaminants can be selected in accordance with the type of contaminants mixed into the system. A microfiltration membrane (MF) apparatus may be used in place of the ultrafiltration membrane apparatus. An ultrafiltration membrane apparatus or a microfiltration membrane apparatus is preferable when the removal of fine particles is the major object due to the excellent accuracy of removal of fine particles, excellent cleanliness and easy handling. As the apparatus for removing contaminants, a column of a cation exchange resin may be disposed when the gas-containing cleaning water after being used contains metal ions as the contaminants, a column of an anion exchange resin may be disposed when the gas-containing cleaning water after being used contains anions and silica as the contaminants, and an apparatus for oxidation under irradiation with ultraviolet light may be disposed when the gas-containing cleaning water after being used contains TOC as the contaminants. The water from which fine particles and the like have been removed is sent to an apparatus for dissolving a gas 14, and hydrogen is dissolved under an increased pressure exceeding the atmospheric pressure. The hydrogen-containing water in which the degree of saturation exceeds 1 due to the dissolution of hydrogen is sent to an apparatus for removing a portion of a gas 15, and the portion of the gas corresponding to the degree of saturation exceeding 1 is removed to obtain a hydrogen-containing cleaning water. Since a gas containing a great amount of hydrogen is discharged from the apparatus for removing a portion of a gas when the hydrogen-containing cleaning water is produced, it is preferable that an oxidation catalyst is attached to the piping for discharging the above gas, and hydrogen is brought into reaction with oxygen to form water so that the danger accompanied with the discharge of hydrogen is prevented. The removed waste gas is passed through an apparatus for treating the waste gas 16 so that hydrogen contained in the waste gas is treated and, then, discharged into the atmosphere or into a duct for the waste gas disposed in the plant. The hydrogen-containing cleaning water is sent to the cleaning machine 7 via a piping for the gas-containing cleaning water. To the piping for the gas-containing cleaning water, a pH meter 18 is attached, and signals are sent from the pH meter to a pump 19. Ammonia water is added to the hydrogen-containing cleaning water from a tank of ammonia water 20, and the pH is adjusted. To the piping for the gas-containing cleaning water, a monitor for dissolved hydrogen 21 is attached, and the concentration of hydrogen in the hydrogen-containing cleaning water is monitored.

In the present invention, the specific gas is dissolved into the gas-containing cleaning water after being used, and the obtained cleaning water containing the dissolved specific gas is supplied again to the cleaning machine and used for the cleaning. Since the temperature of the cleaning water is elevated when the recycling and the reuse of the cleaning water is repeated, it is preferable in the present invention that a heat exchanger is disposed at a desired position in the circulating system so that the elevation in the temperature of the cleaning water is suppressed. In general, the temperature is adjusted around the room temperature. The temperature may be adjusted at a temperature of 40 to 50° C. with stability.

In the present invention, examples of the chemicals added to the gas-containing cleaning water other than ammonia water include alkalis such as sodium hydroxide, potassium hydroxide and tetramethyl-ammonium hydroxide, acids such as hydrogen fluoride, hydrogen chloride and sulfuric acid, chelating agents and surfactants. The chemicals may be used singly or in combination of two or more. The amounts of the chemicals can be controlled in accordance with the values obtained by the measurement of the concentrations of the chemicals or values corresponding to the concentrations as shown in FIG. 3. The chemicals may be added to the water added as the supplement under the proportional control of the amount synchronously with the amount of the water added as the supplement.

When the apparatus shown in FIG. 3 is used, the hydrogen-containing cleaning water is utilized by recycling, and it is sufficient that ultrapure water in the amount corresponding to the amount of the concentrated water removed from the ultrafiltration membrane apparatus is added as the supplement. Therefore, the amount of the ultrapure water used for the cleaning can be decreased remarkably. Hydrogen left remaining in the hydrogen-containing cleaning water after being used, which is recycled from the cleaning machine to the water tank, is not removed by degassing but is utilized as a portion of a component of the freshly prepared hydrogen-containing cleaning water. Therefore, when the hydrogen-containing cleaning water after being used has a relatively great concentration of dissolved hydrogen such as 1 mg/liter or greater and is recycled, the amount of hydrogen gas used for the cleaning can be decreased, and the amount of the discharged hydrogen can be decreased to suppress the danger.

The cleaning apparatus of the present invention is a cleaning apparatus which comprises a cleaning machine using a gas-containing cleaning water which contains a specific gas dissolved in water, an apparatus for dissolving a gas in which the specific gas is dissolved into a gas-containing cleaning water discharged from the cleaning machine after being used under an increased pressure exceeding the atmospheric pressure, an apparatus for removing a portion of a gas in which a portion of the dissolved gas is removed by decreasing the pressure on a gas-containing water obtained from the apparatus for dissolving a gas to a pressure lower than the pressure under which the gas has been dissolved, and a piping for a gas-containing cleaning water by which the gas-containing cleaning water which is discharged from the apparatus for removing a portion of a gas and contains the specific gas dissolved in water is supplied to the cleaning machine. In the cleaning apparatus of the present invention, it is preferable that the gas-containing cleaning water which is discharged from the cleaning machine after being used is circulated through a heat exchanger and an apparatus for removing contaminants. In the apparatus of the present invention, the positions of disposing the heat exchanger and the apparatus for removing contaminants are not particularly limited. The heat exchanger and the apparatus for removing contaminants may be disposed between the cleaning machine and the water tank for storing the gas-containing cleaning water after being used or between the water tank for storing the gas-containing cleaning water after being used and the apparatus for dissolving a gas. The order of disposing the heat exchanger and the apparatus for removing contaminants is not particularly limited, and any of these apparatuses may be disposed at an upstream position.

EXAMPLES

The present invention will be described more specifically with reference to examples in the following. However, the present invention is not limited to the examples.

Example 1

Figure 4:
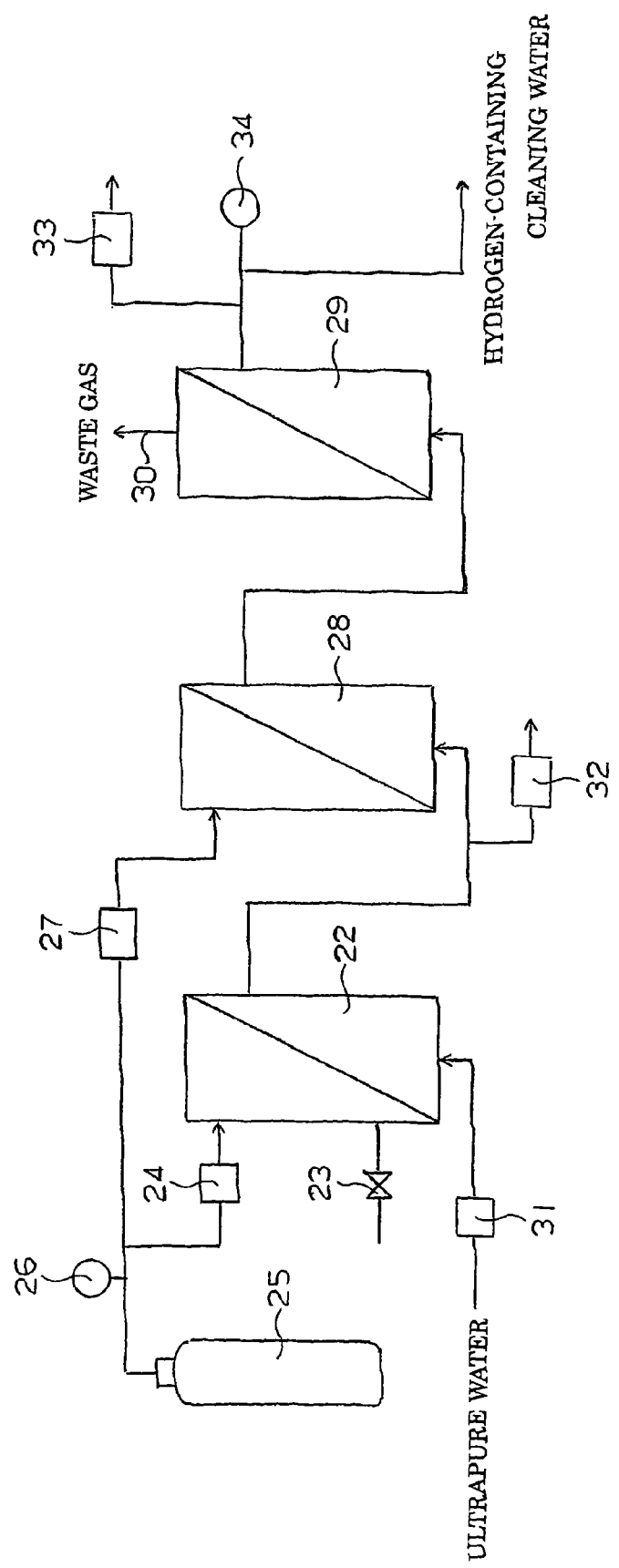
FIG. 4 shows a flow diagram exhibiting a test apparatus used in an Example.

Using gas permeation membrane modules, preparation of a hydrogen-containing cleaning water was conducted. FIG. 4 shows a flow diagram exhibiting a test apparatus used. The aqueous phases of three gas permeation membrane modules [manufactured by CELGARD Co., Ltd.; LIQUI-CEL; the 4-inch type] were connected to each other in series. The gaseous phase of the first gas permeation membrane module 22 was set at the condition such that the gaseous phase could be open to the atmosphere via a valve 23, and was connected to a cylinder of hydrogen 25 via a mass flow controller [manufactured by YAMATAKE Co., Ltd.] 24 so that a prescribed amount of hydrogen could be supplied to the gaseous phase. A pressure gauge 26 was disposed at a piping for supplying hydrogen, and a prescribed amount of hydrogen was supplied to the second gas permeation membrane module 28 by a mass flow controller [manufactured by YAMATAKE Co., Ltd.] 27.

The gaseous phase of the third gas permeation membrane module 29 was open to the atmosphere via a piping 30, and the gas in an amount corresponding to the concentration exceeding the solubility under the atmospheric pressure was removed. Ultrapure water was introduced into the aqueous phase of the first gas permeation membrane module via a water flow meter 31 at a flow rate of 10 liters/minute. The concentration of dissolved hydrogen at the inlet of the second gas permeation membrane module was measured using a meter for the hydrogen concentration [manufactured by HACH ULTRA ANALYTICS JAPAN Inc.] 32, and the concentration of dissolved hydrogen at the outlet of the third gas permeation membrane module was measured using a meter for the hydrogen concentration [manufactured by HACH ULTRA ANALYTICS JAPAN Inc.] 33. The pressure in the aqueous phase of the third gas permeation membrane module was measured by a pressure gauge 34.

In the first step, hydrogen in an amount of 1.6 mg/liter, i.e., in an amount corresponding to the degree of saturation of 1 in water, was dissolved in the second gas permeation membrane module, and the degree of saturation was adjusted at 2. The pressure of water at the outlet of the third gas permeation membrane module was kept at 0.2 MPa. When the gaseous phase of the first gas permeation membrane module was open to the atmosphere so that the gas dissolved in the ultrapure water was in equilibrium with the atmosphere, and the concentration of dissolved hydrogen at the inlet of the second gas permeation membrane module was 0 mg/liter, the concentration of dissolved hydrogen at the outlet of the third gas permeation membrane module was 0.793 mg/liter. Hydrogen was introduced into the gaseous phase of the first gas permeation membrane module just by passing through the gaseous phase without adding any pressure. When the concentration of dissolved hydrogen at the inlet of the second gas permeation membrane module was adjusted at 0.46 mg/liter, and the amount of the entire dissolved gases was such that the concentration of saturation was achieved under the atmospheric pressure, the concentration of dissolved hydrogen at the outlet of the third gas permeation membrane module was 1.017 mg/liter. When the concentration of dissolved hydrogen at the inlet of the second gas permeation membrane module was 0.76 mg/liter, and other conditions were the same as the above, the concentration of dissolved hydrogen at the outlet of the third gas permeation membrane module was 1.163 mg/liter.

When the concentration of dissolved hydrogen at the inlet of the third gas permeation membrane module is represented by $D_1$ (mg/liter) and, after the degree of saturation has been adjusted at 1 by removing the gas in the amount corresponding to the concentration exceeding the solubility under the atmospheric pressure, the concentration of dissolved hydrogen at the outlet of the third gas permeation membrane module is represented by $D_2$ (mg/liter), the relation between $D_1$ and $D_2$ can be expressed by the following equation:

$$D_2 = D_1/(\text{degree of saturation in the second gas permeation membrane module})$$

When the concentration of dissolved hydrogen at the inlet of the second gas permeation membrane module is 0 mg/liter, the concentration of dissolved hydrogen at the inlet of the third gas permeation membrane module $D_1$ is 1.6 mg/liter, and the calculated value of the concentration of dissolved hydrogen at the outlet of the third gas permeation membrane module $D_2$ is 1.6/2 mg/liter=0.8 mg/liter. When the concentration of dissolved hydrogen at the inlet of the second gas permeation membrane module is 0.46 mg/liter, the value of $D_1$ is (0.46+1.6) mg/liter, and the calculated value of $D_2$ is (0.46+1.6)/2 mg/liter=1.03 mg/liter. When the concentration of dissolved hydrogen at the inlet of the second gas permeation membrane module is 0.76 mg/liter, the value of $D_1$ is (0.76+1.6) mg/liter, and the calculated value of $D_2$ is (0.76+1.6)/2 mg/liter=1.18 mg/liter.

Then, the same procedures as those conducted in the above were conducted except that, in the second gas permeation membrane module, hydrogen in an amount of 3.2 mg/liter, i.e., in an amount corresponding to the degree of saturation of 2 in water, was dissolved so that the degree of saturation in water was adjusted at 3. When the concentration of dissolved hydrogen at the inlet of the second gas permeation membrane module was 0 mg/liter, the concentration of dissolved hydrogen at the outlet of the third gas permeation membrane module was 1.015 mg/liter. When the concentration of dissolved hydrogen of at the inlet of the second gas permeation membrane module was 0.46 mg/liter, the concentration of dissolved hydrogen at the outlet of the third gas permeation membrane module was 1.167 mg/liter. When the concentration of dissolved hydrogen of at the inlet of the second gas permeation membrane module was 0.76 mg/liter, the concentration of dissolved hydrogen at the outlet of the third gas permeation membrane module was 1.260 mg/liter.

When the concentration of dissolved hydrogen of at the inlet of the second gas permeation membrane module is 0 mg/liter, the concentration of dissolved hydrogen at the inlet of the third gas permeation membrane module $D_1$ is 3.2 mg/liter, and the calculated value of $D_2$ is 3.2/3 mg/liter=1.07 mg/liter. When the concentration of dissolved hydrogen of at the inlet of the second gas permeation membrane module is 0.46 mg/liter, the value of $D_1$ is (0.46+3.2) mg/liter, and the calculated value of $D_2$ is (0.46+3.2)/3 mg/liter=1.22 mg/liter. When the concentration of dissolved hydrogen of at the inlet of the second gas permeation membrane module is 0.76 mg/liter, the value of $D_1$ is (0.76+3.2) mg/liter, and the calculated value of $D_2$ is (0.76+3.2)/3 mg/liter=1.32 mg/liter.

Then, the concentration of dissolved hydrogen at the inlet of the second gas permeation membrane module was adjusted at 1.0 mg/liter, and hydrogen in an amount of 0.8 mg/liter, i.e., an amount corresponding to the degree of saturation in water of 0.5, was dissolved so that the degree of saturation in water was adjusted at 1.5. Thereafter, the degree of saturation was adjusted at 1 in the third gas permeation membrane module. In this case, $D_2=1.8/1.5=1.2$ mg/liter, The concentration of dissolved hydrogen at the inlet of the second gas permeation membrane module, the amount of hydrogen dissolved in the second gas permeation membrane module and the measured value and calculated value of the concentration of dissolved hydrogen at the outlet of the third gas permeation membrane module are shown in Table 1.

TABLE 1

| Concentration of hydrogen at inlet of second module (mg/liter) | Amount of hydrogen dissolved in second module (mg/liter) | Concentration of hydrogen at outlet of third module (mg/liter) | |
| --- | --- | --- | --- |
| | | measured value | calculated value |
| 0 | 1.6 | 0.793 | 0.8 |
| 0.46 | (corresponding to degree of saturation of 1) | 1.017 | 1.03 |
| 0.76 | | 1.163 | 1.18 |
| 0 | 3.2 | 1.015 | 1.07 |
| 0.46 | (corresponding to degree of saturation of 2) | 1.167 | 1.22 |
| 0.76 | | 1.260 | 1.32 |

TABLE 1-continued

| Concentration of hydrogen at inlet of second module (mg/liter) | Amount of hydrogen dissolved in second module (mg/liter) | Concentration of hydrogen at outlet of third module (mg/liter) | |
|---|---|---|---|
| | | measured value | calculated value |
| 1.00 | 0.8 (corresponding to degree of saturation of 0.5) | 1.180 | 1.2 |

As shown in Table 1, the measured values and the calculated values of the concentration of dissolved hydrogen at the outlet of the third gas permeation membrane module agree with each other well. When hydrogen in an amount corresponding to the degree of saturation of 2 was dissolved in the second gas permeation membrane module, the hydrogen-containing cleaning water having a concentration of dissolved hydrogen of 1.2 mg/liter, a value greatly exceeding 1 mg/liter required for exhibiting the cleaning effect, could be obtained. When hydrogen in the amount corresponding to the degree of saturation of 2 was dissolved in the second gas permeation membrane module, the difference in the measured value and the calculated value was greater than that when hydrogen in the amount corresponding to the degree of saturation of 1 was dissolved. This result is considered to be obtained since the amount of hydrogen which is actually not dissolved in water increases as the amount of hydrogen introduced into the gaseous phase under an increased pressure increases.

As shown in the last row in Table 1, the present invention is particularly useful when the concentration of dissolved hydrogen at the inlet of a gas permeation membrane module for dissolving hydrogen under an increased pressure is relatively great. When a conventional process is applied to the above case, 1.0 mg/liter of hydrogen is removed by a vacuum pump and, then, 1.2 mg/liter of hydrogen in supplied. In contrast, in the present invention, 0.8 mg/liter of hydrogen is supplied, and 0.6 mg/liter of hydrogen is removed without using a vacuum pump. The effect of decreasing the amount of consumed hydrogen can be exhibited in combination with the effect of enhancing the safety.

The pressure of water at the outlet of the third gas permeation membrane module was kept at 0.05 MPa, and the gaseous phase of the first gas permeation membrane module was opened to the atmosphere. Under this condition, hydrogen in an amount of 1.6 mg/liter (corresponding to the degree of saturation of 1) or in an amount of 3.2 mg/liter (corresponding to the degree of saturation of 2) was dissolved in the second gas permeation membrane module, and the concentration of dissolved hydrogen at the outlet of the third gas permeation membrane module membrane was measured. The concentration of dissolved hydrogen was 0.798 mg/liter or 1.006 mg/liter, respectively. The result is shown in Table 2. The result obtained when the pressure of water at the outlet was kept at 0.2 MPa is also shown in Table 2.

TABLE 2

| Amount of hydrogen dissolved in second module (mg/liter) | Pressure of water at outlet of third module (MPa) | Concentration of hydrogen at outlet of third module (mg/liter) |
|---|---|---|
| 1.6 (corresponding to degree of saturation of 1) | 0.05 0.2 | 0.798 0.793 |
| 3.2 (corresponding to degree of saturation of 2) | 0.05 0.2 | 1.006 1.015 |

As shown in Table 2, the pressure of water at the outlet of the third gas permeation membrane module did not affect the dissolution of hydrogen.

Example 2

The hydrogen-containing cleaning water prepared in accordance with the present invention was used for cleaning a glass substrate having a great size by a cleaning machine.

The hydrogen-containing cleaning water was applied to cleaning of a glass substrate having a great size in a cleaning tank having a capacity of 600 liters. Water overflowing from the cleaning tank was received in a storage tank having a capacity of 500 liters. Water in the storage tank was transferred by a pump at a rate of 100 liters/minute under a pressure of 0.2 MPa and passed through an ultrafiltration membrane (UF) module [manufactured by KURITA KOGYO Co., Ltd.; KU1510-HS] in the first step. Concentrated water containing foreign substances was removed at a rate of 20 liters/minute. Ultrapure water introduced from a branched piping at a rate of 20 liters/minute was combined with the main stream water at the downstream side of the ultrafiltration membrane module, and the flow rate of the entire water was kept at 100 liters/minute. This water was introduced into a gas permeation membrane module for dissolving hydrogen. When the concentration of dissolved hydrogen in the water taken from the branched piping immediately before the gas permeation membrane module was measured, the concentration of dissolved hydrogen was found to be 0.8 mg/liter. It was also found that 7 mg/liter of nitrogen and 4 mg/liter of oxygen were dissolved.

Hydrogen was supplied to the gas permeation membrane module at a flow rate of 1,800 ml (the standard condition)/minute under a gauge pressure of 0.15 MPa, and the entire amount of hydrogen was dissolved under the added pressure. The concentration of dissolved hydrogen immediately after this operation was 2.4 mg/liter, and the concentration of dissolved nitrogen and the concentration of dissolved oxygen were the same as those at the inlet of the gas permeation membrane module. When the concentrations are expressed in terms of the degree of saturation, hydrogen in a concentration corresponding to a degree of saturation of 1.5 and the components of the air in a concentration corresponding to a degree of saturation of 0.5 were dissolved, and the concentration of the entire dissolved gases corresponded to a degree of saturation of 2.

An additional gas permeation membrane module as the apparatus for removing gases in amounts exceeding the concentration of saturation was disposed at the downstream of the gas permeation membrane module for dissolving hydrogen. A tube was attached to the connecting point of the gaseous phase and connected to a column of an oxidation catalyst. The portion between the above members were kept approximately at the atmospheric pressure without attaching valves or the like causing pressure losses. A sample of water was taken immediately after the gas in the amount exceeding the concentration of saturation was removed, and the concentrations of dissolved gases were measured. The concentration of hydrogen was 1.2 mg/liter (corresponding to a degree of saturation of 0.75). The concentration of nitrogen was 4.5 mg/liter and the concentration of oxygen was 2.0 mg/liter (corresponding to a degree of saturation of 0.25 as the entire components of the air). The required concentration of dissolved hydrogen, i.e., 1 mg/liter or greater, was sufficiently satisfied.

The temperature of the water of the supplement was 23° C., and the temperature of the circulating water at the inlet of the cleaning tank was 27° C., which was slightly higher than that of the water of the supplement. However, no adjustment of the temperature was conducted, and the operation was continued after it was confirmed that the condition was stabilized at the above temperatures.

In the cleaning machine, ultrasonic wave of 40 kHz was used in combination, and cleaning with dipping was conducted for 5 minutes using glass substrates having a size of about 1 m square as the article for cleaning. The number of fine particles having a size of 1 μm or greater on the glass substrates before the cleaning was about 4,000 in average. Ten glass substrates were cleaned using ultrapure water, a prepared hydrogen-containing cleaning water having a concentration of dissolved hydrogen of 1.2 mg/liter or a cleaning water prepared by adding 3 to 5 mg/liter of ammonia to the above cleaning water. The number of fine particles having a size of 1 μm or greater on the glass substrates after the cleaning was about 800 when ultrapure water was used, about 70 when the prepared cleaning water was used, and about 30 when the cleaning water containing added ammonia was used.

It was confirmed from the above results that the highly efficient cleaning could be conducted by using the hydrogen-containing cleaning water which is supplied and circulated in accordance with the process of the present invention and by using the apparatus of the present invention. It was also shown that the effect of cleaning can be enhanced by adding a small amount of ammonia to the hydrogen-containing cleaning water.

INDUSTRIAL APPLICABILITY

In accordance with the process for producing a gas-containing cleaning water and by using the apparatus for producing the cleaning water and the cleaning apparatus, the gas-containing cleaning water in which the specific gas is dissolved in a great concentration can be supplied safely with stability without using a mechanism for decreasing the pressure such as a pump for removing a gas. In particular, the process and the apparatuses of the present invention can be advantageously applied with great practical value when a great amount of water is recycled and reused.

The invention claimed is:

1. A process for producing a gas-containing cleaning water which contains a specific gas dissolved in water, which process comprises (i) dissolving the specific gas into a material water containing other gases than the specific gas present in the water under an increased pressure exceeding an atmospheric pressure to prepare a gas-containing water having a concentration of the specific gas exceeding the solubility of the specific gas under an atmospheric pressure and, then, (ii) removing a portion of the dissolved gases to remove the portion of the dissolved gases exceeding the concentration of saturation by decreasing pressure on the gas-containing water to a pressure in the range of ±20% of the atmospheric pressure by passing the gas-containing water having a concentration of the specific gas exceeding the solubility of the specific gas under an atmospheric pressure through a gas permeation membrane module, a gaseous phase portion of which is opened to the atmosphere or is connected to the atmosphere in a manner such that there is no pressure loss.

2. The process for producing a gas-containing cleaning water according to claim 1, wherein an operation of dissolving the specific gas into water under an increased pressure to prepare the gas-containing water having a concentration of the gas exceeding the solubility of the gas under an atmospheric pressure and an operation of removing the portion of the dissolved gas by decreasing pressure on the gas-containing water are repeatedly conducted.

3. The process for producing a gas-containing cleaning water according to claim 1, wherein the water into which the specific gas is dissolved under an increased pressure is a gas-containing cleaning water after being used.

4. The process for producing a gas-containing cleaning water according to claim 3, which comprises a step of removing contaminants in the gas-containing cleaning water.

5. The process for producing a gas-containing cleaning water according to claim 1, wherein the specific gas is hydrogen, and a removed waste gas discharged from a gaseous phase portion of the gas permeation membrane module is treated by an apparatus for treating a waste gas in which hydrogen is brought into reaction with oxygen to form water.

6. An apparatus for producing a gas-containing cleaning water which contains a specific gas dissolved in water, which apparatus comprises (i) an apparatus for dissolving a gas in which the specific gas is dissolved into a material water containing other gases present in the water to prepare a gas-containing water containing the specific gas in combination with the other gases present in the material water under an increased pressure exceeding an atmospheric pressure and (ii) an apparatus for removing a portion of a gas in which a portion of the dissolved gases is removed by decreasing pressure on the gas-containing water obtained from the apparatus for dissolving a gas to a pressure lower than the pressure under which the specific gas has been dissolved, wherein the apparatus for removing a portion of a dissolved gas is an apparatus comprising a gas permeation membrane module to an aqueous phase of which the gas-containing water is transformed, and a gaseous phase portion of the gas permeation membrane module is opened to the atmosphere or is connected to the atmosphere in a manner such that there is no pressure loss and the pressure on the gas-containing water is decreased to a pressure in the range of ±20% of the atmospheric pressure.

7. A cleaning apparatus which comprises (i) a cleaning machine using a gas-containing cleaning water containing a specific gas dissolved in water, (ii) an apparatus for dissolving a gas in which the specific gas is dissolved into the gas-containing cleaning water discharged from the cleaning machine after being used under an increased pressure exceeding an atmospheric pressure, (iii) an apparatus for removing a portion of a gas in which a portion of the dissolved gas is removed by decreasing pressure on a gas-containing water obtained from the apparatus for dissolving a gas to a pressure lower than the pressure under which the specific gas has been dissolved, and (iv) a piping for a gas-containing cleaning water by which the gas-containing cleaning water which is discharged from the apparatus for removing a portion of a gas and contains the specific gas dissolved in water is supplied to the cleaning machine, wherein the apparatus for removing a portion of a dissolved gas is an apparatus comprising a gas permeation membrane module to an aqueous phase of which the gas-containing water is transformed, and a gaseous phase portion of the gas permeation membrane module is opened to the atmosphere or is connected to the atmosphere in a manner such that there is no pressure loss and the pressure on the gas-containing water is decreased to a pressure in the range of ±20% of the atmospheric pressure.

8. The cleaning apparatus according to claim 7, wherein the gas-containing cleaning water which is discharged from the cleaning machine after being used is circulated through a heat exchanger to treat the gas-containing cleaning water for a temperature adjustment and an apparatus for removing contaminants.

9. The apparatus for producing a gas-containing cleaning water according to claim 6, wherein a plurality of pairs of the apparatus for dissolving a gas and the apparatus for removing a portion of a dissolved gas are arranged in a manner such that the apparatus for dissolving a gas and the apparatus for removing a portion of a dissolved gas are arranged alternately.

10. The apparatus for producing a gas-containing cleaning water according to claim 6, which comprises a recycling pipe for recycling a gas-containing cleaning water after being used to the apparatus for dissolving a gas.

11. The apparatus for producing a gas-containing cleaning water according to claim 10, which comprises an apparatus for removing contaminants in the gas-containing cleaning water.

12. The process according to claim 1, wherein the specific gas is dissolved into the material water via a gas permeation membrane by introducing the material water into an aqueous phase of an apparatus for dissolving a gas and introducing the specific gas into a gaseous phase under a pressure exceeding the atmospheric pressure.

13. The process according to claim 2, wherein the specific gas is dissolved into the material water via a gas permeation membrane by introducing the material water into an aqueous phase of an apparatus for dissolving a gas and introducing the specific gas into a gaseous phase under a pressure exceeding the atmospheric pressure.

14. The process according to claim 2, wherein the specific gas is hydrogen, and a removed waste gas discharged from the gaseous phase portion of the gas permeation membrane module is treated by an apparatus for treating a waste gas.

15. The process according to claim 12, wherein the specific gas is hydrogen, and a removed waste gas discharged from the gaseous phase portion of the gas permeation membrane module is treated by an apparatus for treating a waste gas.

16. The process according to claim 13, wherein the specific gas is hydrogen, and a removed waste gas discharged from the gaseous phase portion of the gas permeation membrane module is treated by an apparatus for treating a waste gas.

17. The apparatus according to claim 6, wherein the apparatus for dissolving the gas is a gas permeation membrane module and the material water is introduced into an aqueous phase of the gas permeation membrane module and the specific gas is introduced into a gaseous phase of the gas permeation membrane module.

18. The apparatus according to claim 7, wherein the apparatus for dissolving the gas is a gas permeation membrane module and the gas-containing cleaning water discharged from the cleaning machine is introduced into an aqueous phase of the gas permeation membrane module and the specific gas is introduced into a gaseous phase.

19. The apparatus according to claim 17, wherein the specific gas is hydrogen, and a removed waste gas discharged from the gaseous phase portion of the gas permeation membrane module is treated by an apparatus for treating a waste gas.

20. The apparatus according to claim 18, wherein the specific gas is hydrogen, and a removed waste gas discharged from the gaseous phase portion of the gas permeation membrane module is treated by an apparatus for treating a waste gas.

* * * * *